United States Patent [19]

Lim et al.

[11] Patent Number: 5,580,171

[45] Date of Patent: Dec. 3, 1996

[54] SOLIDS MIXING, STORING AND CONVEYING SYSTEM FOR USE WITH A FURNACE FOR SINGLE CRYSTAL SILICON PRODUCTION

[76] Inventors: John C. Lim, 2589 N. Mountain Ave., Claremont, Calif. 91711; William A. Koch, 1781 Alicante, Pomona, Calif. 91768; Mohan Chandra, 11305 Mountain View Dr., Rancho Cucamonga, Calif. 91730

[21] Appl. No.: 506,116

[22] Filed: Jul. 24, 1995

[51] Int. Cl.$^6$ ............................ B04B 5/06; C30B 15/00
[52] U.S. Cl. ........................ 366/336; 117/213; 117/214; 117/216; 198/443; 222/459
[58] Field of Search ............................ 366/336, 337, 366/338, 339, 340, 9, 341, 144, 146, 147; 222/161, 459, 409; 198/758, 771, 533, 443; 117/213, 214, 216

[56] References Cited

U.S. PATENT DOCUMENTS

| | | | |
|---|---|---|---|
| 1,496,896 | 6/1924 | Laffoon | 366/337 |
| 1,977,300 | 10/1934 | Blunt | 366/336 |
| 4,502,615 | 3/1985 | Stangl | 198/771 |
| 4,594,005 | 6/1986 | Sakamoto | 366/336 |
| 4,809,880 | 3/1989 | Stein | 222/161 |
| 5,087,128 | 2/1992 | Matthews | 366/336 |
| 5,314,667 | 5/1994 | Lim | 117/213 |
| 5,397,179 | 3/1995 | Berlin | 366/336 |

*Primary Examiner*—Robert W. Jenkins
*Attorney, Agent, or Firm*—Plante & Strauss

[57] ABSTRACT

There is disclosed a static mixer for intimate mixing of granular solids, a solids flow controller and a solids transfer tube which are useful to mix polycrystalline material with dopant solids, and to feed the resultant mixture continuously and accurately into a modified Czochralski-type furnace for growing single crystal material. The static mixer is a series of conical funnel plates interspaced by thieving divider plates that are formed by a plurality of triangular V-shaped, radial sectors. Contiguous to the static mixer is a storage hopper which has sufficient storage capacity for all the polycrystalline feed material required in a single run of the furnace. Located beneath the hopper is a solids flow controller that is a V-shaped trough which is vibrated along its longitudinal axis. At one end, the trough has a transverse baffle located with a gap between its bottom edge and the bottom of the trough that controls the rate of flow of the solids. The solids are discharged from the opposite end of the trough into a vertically disposed tube. Within the furnace, there is a solids transfer tube with its lower terminating immediately above the molten pool in the solids replenishment zone. The solids transfer tube also has internal constrictions to reduce the velocity of the solids, and has an opaque section which prevents radiant heat transfer from the furnace.

18 Claims, 3 Drawing Sheets

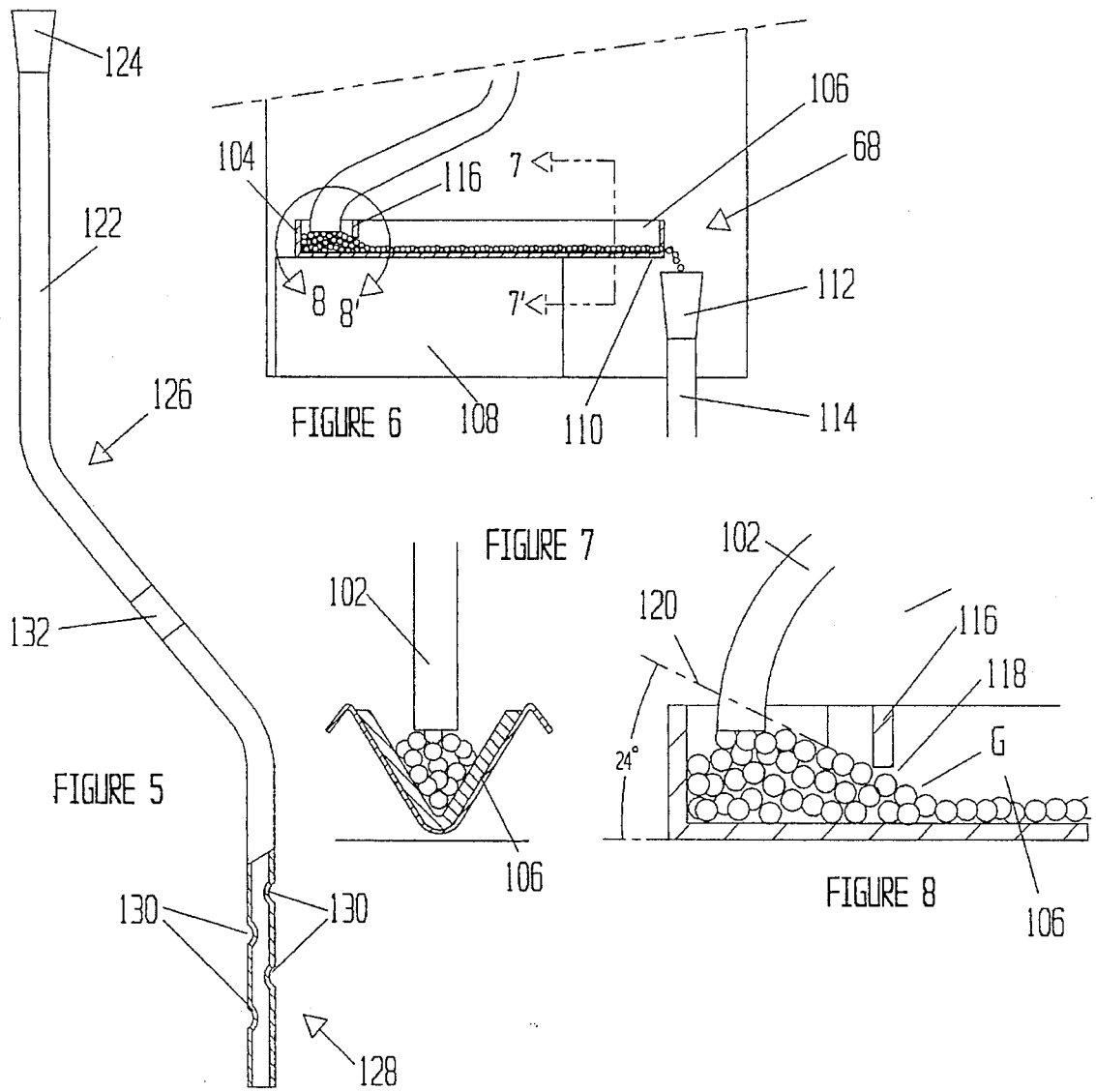

SOLIDS MIXING, STORING AND CONVEYING SYSTEM FOR USE WITH A FURNACE FOR SINGLE CRYSTAL SILICON PRODUCTION

BACKGROUND OF THE INVENTION

1. Field of Invention

This invention relates to a solids mixing, storage and conveying, and, in particular to an improved static mixer, hopper and conveyor to introduce a continuous flow of granular material such as polycrystalline silicon into a high temperature furnace for the production of single crystal ingots.

2. Brief Statement of the Prior Art

Single crystal silicon is the basic substrate used for virtually all semiconductor devices. Other single crystal materials which are also finding applications in semiconductor devices are Periodic Table Group III elements, particularly in combination with Group VI and Group V elements, e.g., germanium and gallium arsenide. These materials are synthetically produced in a purified and perfect, single crystal state. The method traditionally used for such production has been the Czochralski method. In the Czochralski method, polycrystalline material, such as silicon, is melted and maintained in a molten state in a quartz crucible. The quartz crucible is mounted in a heated furnace, usually supported by a graphite cup. A seed crystal of silicon is dipped in the molten silicon and is slowly withdrawn, forming a cylindrical boule of single crystal silicon. The boule and crucible are rotated counter-rotationally to promote uniformity of silicon properties and distribution of impurities and dopant additives within the silicon.

The Czochralski process is conducted batch-wise and inherent limitations of batch-wise processing cause, or promote, variations in properties and composition of the silicon boule. Dopants such as phosphorus or boron are usually added to the silicon melt to impart desirable semiconductor properties to the silicon wafers which are sliced from the cylindrical silicon boule. The dopants tend to concentrate in the molten pool as the pool is deplenished by the forming of the boule. Additionally, oxygen is introduced into the molten pool from reaction of the silicon melt with the surfaces of the quartz crucible. As the level of the molten pool decreases during the batch processing the wetted surface area decreases, resulting in a continuous decrease in oxygen concentration in the melt.

These and related inherent limitations in the Czochralski process have led to the improved processes which are described in U.S. Pat. No. 4,659,421 and 5,314,667. In these improved processes, a shallow molten pool of silicon is maintained in a crucible to reduce the variation of dopant and oxygen contents in the cylindrical boule withdrawn from the pool. Polycrystalline silicon is continuously introduced into a silicon replenishment zone which is separated from the crystal growth zone, where the boule is formed. In the U.S. Pat. No. 5,314,667 patent, the replenishment zone is an annular zone surrounding the central crystal-growth zone.

Silicon is continuous introduced into the furnaces of these improved process; in the U.S. Pat. No. 4,659,421 patent, the silicon is supplied as a solid rod to stir the molten silicon pool, while in the U.S. Pat. No. 5,314,667 patent, granular silicon is introduced into the replenishment zone.

It is also difficult to introduce granular material into a high temperature furnace at closely controlled feed rates, as required to avoid upsetting the process conditions within the furnace. A common problem with all silicon crystal growth furnaces is the difficulty of obtaining intimate distribution of the minor quantities of dopant throughout the polycrystalline silicon supplied to the furnace so that variations in dopant concentration are avoided in the single crystal boule.

OBJECTS OF THE INVENTION

It is an object of this invention to provide an improved process for the production of single crystal silicon.

It is a further object of this invention to provide a process for the production of cylindrical ingots of single crystal silicon of substantially improved uniformity and purity.

It is an additional object of this invention to provide equipment suitable for the continuous introduction of polycrystalline granules into a furnace for the growth of single crystal material.

It is also an object of this invention to provide equipment for static mixing of granules of polycrystalline silicon with dopant solids.

Other and related objects will be apparent from the following description of the invention.

BRIEF STATEMENT OF THE INVENTION

This invention comprises a static mixer for intimate mixing of granular solids, a solids flow controller and a solids transfer tube which are useful to mix polycrystalline material with dopant solids, and to feed the resultant mixture continuously and accurately into a modified Czochralski-type furnace for growing single crystal material. The static mixer is a series of conical funnel plates which are interspaced by thieving divider plates that are formed by a plurality of triangular V-shaped, radial sectors, each sector joined along its longitudinal edges to the immediately adjacent sectors, thereby forming a convoluted plate in which each sector functions as a thief to divide the granular mixture of solids which cascades onto the center of the plate from the superior funnel plate. Contiguous to the static mixer is a storage hopper which has sufficient storage capacity for all the polycrystalline feed material required in a single run of the furnace. Located beneath the hopper is a solids flow controlled that is a V-shaped trough which is vibrated along its longitudinal axis. At one end, the trough has a transverse baffle which functions as a gate, with a gap between its bottom edge and the bottom of the trough that controls the rate of flow of the solids. The solids are discharged from the opposite end of the trough into a vertically disposed tube. Within the furnace, there is a solids transfer tube with its lower terminating immediately above the molten pool in the solids replenishment zone. The solids transfer tube also has internal constrictions to reduce the velocity of the solids, and has an opaque section which prevents radiant heat transfer from the furnace.

BRIEF DESCRIPTION OF THE DRAWINGS

The invention will be described with reference to the Figures of which:

FIG. 5 is an elevational view, partially in cross section of the solids transfer tube of the invention;

FIG. 6 is an enlarged view of the solids conveyor and flow controller of the invention;

FIG. 7 is a sectional view along line 7—7' of FIG. 6; and

FIG. 8 is an enlarged view of the area within line 8—8' of FIG. 6.

DESCRIPTION OF PREFERRED EMBODIMENT

Figure 1:
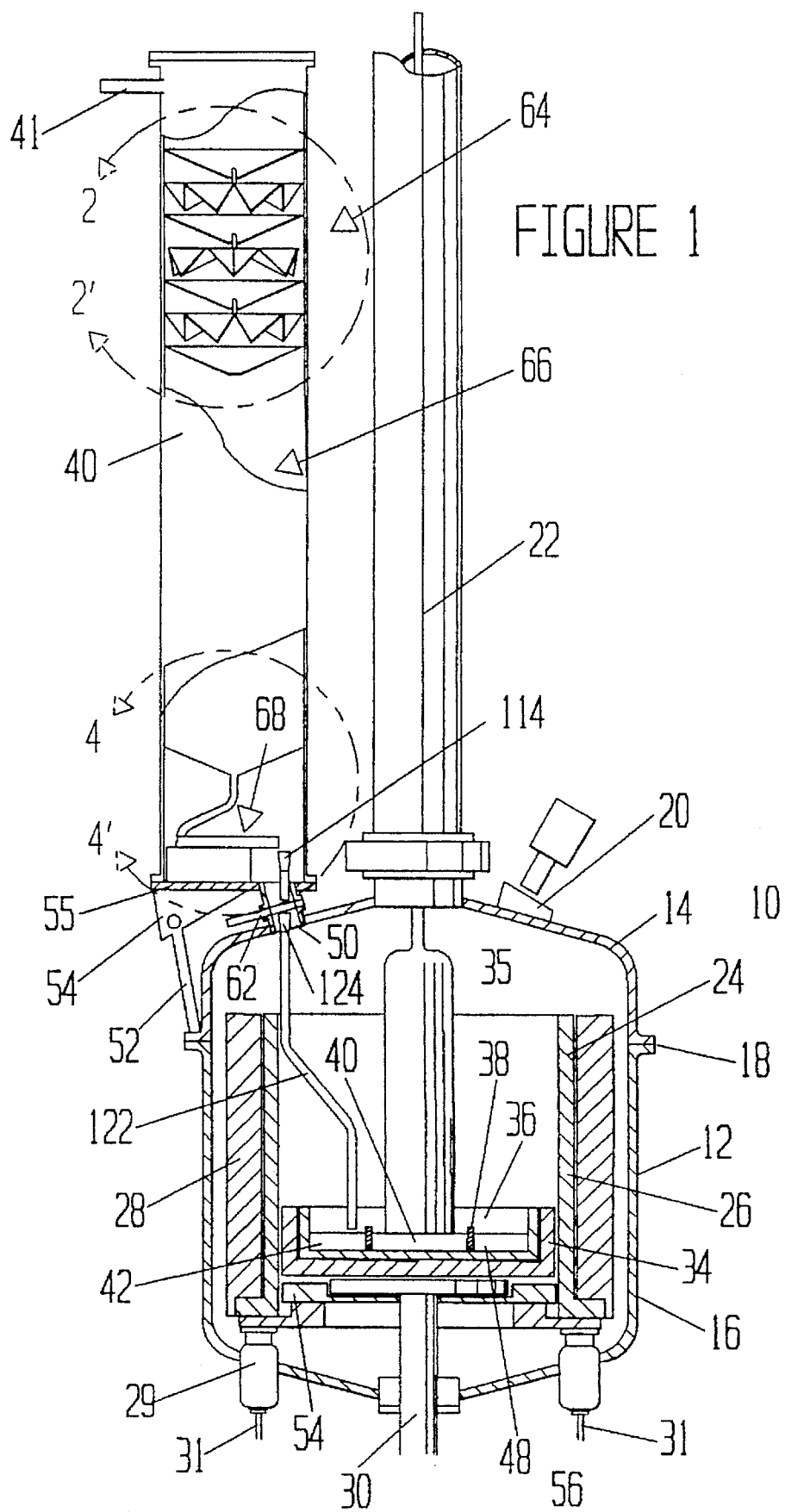
FIG. 1 is a sectional elevational view of a modified Czochralski process furnace that includes the solid mixing, storing and transferring equipment of this invention.

The invention is applied to a modified Czochralski process furnace such as that illustrated in FIG. 1. The furnace 10 is contained a surrounding vacuum chamber 12 formed from an upper half shell 14 and a lower half shell 16 which are joined together by annular flanges 18. The upper half shell 14 has a viewing port 20 and a centrally located, axially extending crystal receiving chamber 22. The vacuum chamber 12 contains a centrally located, furnace 10 which includes a circular heater 24 formed of vertical graphite elements which are supplied with electrical power from electrical leads 31 which pass into the chamber through connectors 29. The heater 24 is surrounded by a protective cylindrical heat shield 28.

A centrally located shaft 30 extends axially into the lower shell 16, and this shaft is mounted for rotational and axial movement. The upper end 32 of the shaft 30 supports a graphite cup 34 in which is placed a quartz crucible 36. The crucible has a flat bottom, and short side walls, thereby permitting use of a one to minimize the quantity of the molten pool of silicon.

A circular baffle or weir 38 is centrally positioned in the crucible 36, closely surrounding the cylindrical boule 35 dividing the shallow molten pool 48 into a crystal growth zone 40 and an entirely surrounding annular feed zone 42. The crucible 36 is received within a graphite cup 34 which is surrounded by heater 24 and by a bottom heater 54. Electrical power is supplied to heater 54 by plate 56.

A single seed crystal of silicon is dipped into the molten pool in the crystal growth zone 40 and is slowly withdrawn, while being rotated in a counter-rotational direction to the rotation of the graphite cup and crucible. As the crystal is withdrawn, the molten silicon at the crystal solid/liquid interface crystallizes, forming a cylindrical boule 35.

The vacuum chamber is continuously swept with a flow of argon which is introduced through the crystal receiving chamber 22 and which flows along the upper shell 14, downwardly about the cylindrical silicon boule 35 and across the molten pool 48 of the silicon. This flow of argon sweeps silicon oxide, which is formed by reaction of the silicon melt with the quartz crucible, from the vacuum chamber 12.

The feed solids conditioning and conveyor system of this invention is housed in vessel 40 which is supported on the furnace, secured to nozzle 50 of upper shell 14, and supported by an arm 52 which is attached to a support bracket 54 on the lower end plate 56 of the vessel 40. The vessel 40 is supported beside the boule withdrawal column 22 and has a nozzle 60 in its lower end plate 56 which is bolted to a flanged nozzle 50 of the upper portion of the furnace. A slide gate valve 62 is placed between the furnace and the vessel 40, permitting isolation of the vessel from the furnace.

The static solids mixer 64 of the invention is located in the upper portion of the vessel 40. A solids storage hopper 66 is located in the mid-section of the vessel 40, and a solids flow controller 68 is located in the lower portion of the vessel 40.

Figure 2:
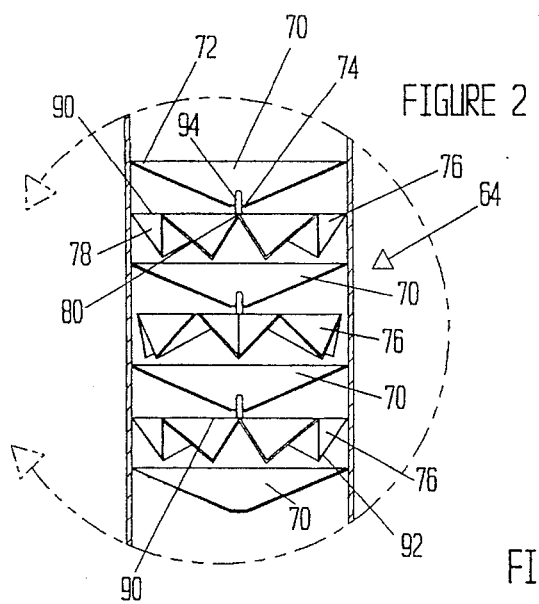
FIG. 2 is an enlarged view of the area within line 2—2' of FIG. 1.
Figure 3:
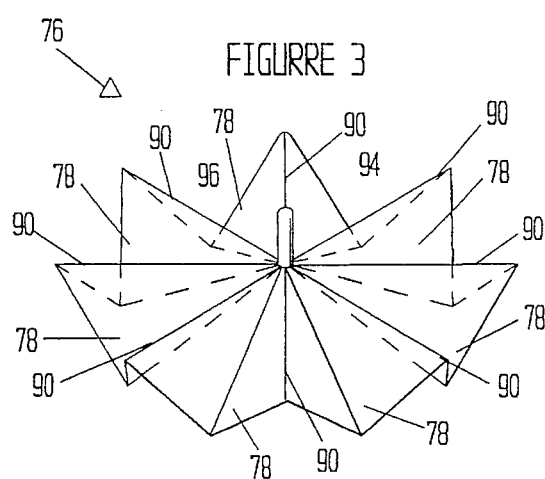
FIG. 3 is a simplified illustration of the convoluted mixer plate of the static mixer of the invention.

Referring now to FIGS. 2 and 3, the static mixer 64 will be described. The static mixer 64 comprises a plurality of alternating funnel and thieving divider plates. Each funnel plate 70 is a conical plate with its outer edge 72 secured to the inner wall of housing 40. Each funnel plate 70 has a central through aperture 74 at its apex.

Each thieving divider plate 76 has a plurality of V-shaped sector troughs 78, each trough 78 being triangular with its apex at the center 80 of the plate 76, and with each of its radial edges 90 joined to the radial edges of the next adjacent troughs. In the preferred embodiment, eight sector troughs are provided in the thieving divider plate 76, however, any suitable number from 2 to about 12 such troughs can be provided in a single thieving divider plate. As apparent from FIG. 2, the lower ends 92 of the V-shaped sector troughs 78 terminate short of the inner wall of the housing 40, to provide a discharge path for solids from each trough onto the subjacent funnel plate 70.

The number of thieving divider plates 76, and the number of divider troughs 78 in each plate can be varied, as desired, for the desired number of stages of separation and mixing of the solids. In the illustrated embodiment, a plurality of three thieving divider plates 78, with eight divider troughs each are interspaced with four funnel plates to provide $8^3$ or 512 stages of lateral mixing.

A rod 94 is supported within the central aperture 74 of each funnel plate 70. While various rod supports can be used, the preferred construction is to support each rod 94 on the apex 96 of the subjacent thieving divider plate 76 so that the rod 94 projects upwardly, into the central aperture 74 of the funnel plate 70 located above the divider plate 76. The rod 94 functions as an averaging rod, forming an annulus through which the solids are discharged evenly onto the subjacent thieving divider plate 76.

Figure 4:
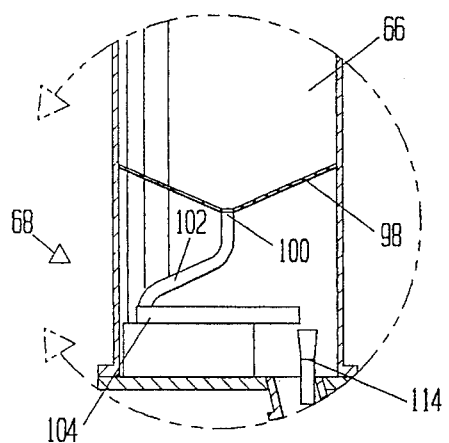
FIG. 4 is an enlarged view of the area within line 4—4' of FIG. 1.

The storage hopper 66 has sufficient capacity to store the quantity of feed solids required for a complete run of the furnace, typically from about one to about four runs. As shown in FIGS. 1 and 4, the hopper has a conical bottom wall 98 with a central outlet nozzle 100 which supports delivery tube 102 that extends from the central nozzle 100 to one end 104 of the solids flow controller 68.

The solids flow controller 68 is shown in greater detail in FIGS. 4, 6 and 7. The controller 68 comprises a V-shaped trough 106 (see FIG. 7), which is mounted for reciprocation on a vibratory shaker 108, and which has its discharge end 110 located above the upper end 112 of a short transfer tube 114. Referring to FIG. 6, a transverse baffle 116 is located at the inlet end 104 of the trough 106 with its lower edge above the lower edge of the trough by a distance G, providing a gap which limits the rate of flow of solids. As shown in FIG. 8, the baffle 116 is located with its lower edge 118 lying on an imaginary plane 120 that is inclined at the normal angle of repose of the granular solids and that intersects the discharge end of the delivery tube 102. In the case of granular silicon having a size range from about 1 to about 1.5 millimeters, average particle diameter, this angle of repose is 24 degrees. The rate of flow of solids can be controlled by the frequency and amplitude of vibrations of the trough. These variables are readily controlled by the electromagnetic vibrator 108, thereby providing a simple process flow controller that response to the electrical signals supplied to the vibrator 108. The length of the trough 106 should be sufficient to average out the flow of solids so that the solids are discharged as a continuous, substantially non-variable stream.

For the preferred embodiment and maximum flow rate of 260 grams/minute of polycrystalline silicon, a trough with a length of at least 5 inches is sufficient.

A substantially vertical transfer tube 122 is mounted within the furnace (see FIG. 1) with its upper end 124 located beneath the lower end of short tube 114, permitting solids to fall from the short transfer tube 114 into the vertical transfer tube 122, when the slide gate valve is open. The lower end of the vertical transfer tube 122 is positioned immediately above the liquid level of molten material in the annular replenishment (feed) zone 42.

The substantially vertical transfer tube 122 is shown in enlarged view in FIG. 5. This tube 122 has a slight outwardly flared upper end 124 which is supported directly beneath the discharge end of the short transfer tube 114 (see FIG. 1). The tube 122 has a radiation interrupt section 126, and a flow velocity control section 128. The velocity flow control section 128 has a plurality of internal constrictions, which are formed by indentations 130 in the side wall of the tube 122, with adjacent internal constrictions being located on opposite sides of the tube. The constrictions deflect solids in the tube, interrupting their free fall, and prevent splashing of molten silicon in the replenishment zone.

The static mixer plates 70 and 76 are formed of high temperature resistant material which will not introduce contaminates into the furnace. The material of choice is quartz, which is also used to line the V-trough 106 of the flow controller 68, the vessel 40, and for the solids transfer tubes 114 and 122.

The radiation interrupt section 126 is provided in the furnace solids transfer tube to prevent "piping" of radiation from the furnace into the vessel. The transfer of radiation occurs because of the internal reflection of radiation by the quartz tube. To prevent the internal reflection, a short section of opaque quartz 132 is placed in the transfer tube 122, which absorbs, rather than reflects, the radiation, thereby interrupting its transfer into the vessel.

The polycrystalline material such as silicon in granular form, typically with an average particle diameter from 1 to about 1.5 millimeters, is blended with dopant solids and the blended mixture is introduced into the upper end of the vessel, where it cascades downwardly through the stages of the static mixer. The static mixer is very efficient in lateral mixing of the solids so that an intimately mixed blend of polycrystalline and dopant solids is discharged into the storage hopper. The storage hopper has a capacity from 80 to about 200 kilograms of granular solids, sufficient for storage of the feed material required for one to four runs, making silicon ingots of about 50 kilograms.

The frequency and amplitude of vibration of the vibrator is controlled to adjust the feed rate of solids as necessary to maintain the depth of the molten pool 48 of silicon within the crucible at a very shallow depth, from about 0.1 inch to no greater than about 2.0 inches, preferably from about 0.25 to about 1.0 inch. This rate of introduction of the solids into the replenishment zone is regulated to equal the rate of depletinishment of silicon, as controlled by the rate of withdrawal of the cylindrical boule 35. In a typical application, the boule 35 is withdrawn at a rate from about 75 to about 100 millimeters per hour, corresponding to a maximum rate of about 260 grams per minute, for a six inch diameter boule.

The cylindrical boule 35 of single crystal silicon is withdrawn from the crucible 36 and passes through a heated zone 52 entirely surrounded by the cylindrical heater 24. This heated zone 52 serves as an annealing zone in which the crystal is annealed and conditioned to obtain maximum crystal properties, such as strength.

The invention was thus practiced and adopted to utilization of an existing Czochralski furnace and vacuum chamber without major modifications or changes. This resulted in substantial savings in equipment and time, as the existing Czochralski equipment was readily adapted to practice the method.

The invention has been described with reference to the illustrated and presently preferred embodiment. It is not intended that the invention be unduly limited by this disclosure of the presently preferred embodiment. Instead, it is intended that the invention be defined, by the means, and their obvious equivalents, set forth in the following claims:

What is claimed is:

1. A static mixer for granular solids which comprises a combination of:

a. a first plate, which is funnel shaped and having a generally conical configuration with a central aperture at its apex;

b. a second plate located beneath said first plate and having a convoluted surface, formed of a plurality of triangular troughs of substantially equal size and configuration, each located with its triangular apex at the center of said second plate, with said triangular troughs being joined to adjacent ones along their edges, whereby the periphery of said second plate c. a housing surrounding and supporting said first and second plates in superimposed positions.

2. The static mixer of claim 1 wherein said first plate is located above said second plate.

3. The static mixer of claim 2 including a pair of said first plates, one each located above, and below said second plate.

4. The static mixer of claim 1 wherein said triangular troughs have equidilateral edges, whereby said troughs extend to, but do not meet the inner periphery of said housing, thereby forming solids discharges at the radially outward extremities of said troughs.

5. The static mixer of claim 1 wherein said second plate is formed with eight said triangular troughs to provide a plurality of eight divisions of solids received on said second plate.

6. The static mixer of claim 1 including a peg member supported in said central aperture of said first plate to prevent solids channeling through said central aperture.

7. The static mixer of claim 1 including a n plurality of several of said second plates and a n+1 plurality of first plates, with said first and second plates being interspaced, and with a first plate located above and another first plate located beneath said array of plates.

8. A solids mixing and storage vessel which comprises the static mixer of claim 1 located in the upper portions of said housing, a storage hopper located in the middle portion of said housing and formed with a lower wall having an inverted conical shape with a central aperture for discharge of solids.

9. The solids mixing and storage vessel of claim 8 also including at its lower end, beneath said lower wall of said storage hopper, a conveyor for said granular solids, including a tube extending from said central aperture of said lower wall to one end of said conveyor, said conveyor formed of a V-shaped trough mounted horizontally on a support with means permitting its reciprocal movement along its longitudinal axis, and a vibratory motor secured to said trough to vibrate said trough along its longitudinal axis, and a solids introduction hopper located at said one end of said trough, said hopper formed by a baffle transversely oriented in said trough, but spaced above the lower inner edge thereof with its lower edge being located at the angle of repose of said granular solids discharged from said tube.

10. The solids mixing and storage vessel of claim 9 which includes a granular solids transfer tube located with its upper end beneath the discharge end of said solids conveyor to receive granular solids discharged therefrom and to transfer said granular solids to a lower location, which transfer tube includes a vertical section having a plurality of internal constrictions formed along its inner side wall, each said flight comprising an inwardly deflected side wall portion of said tube whereby the vertical fall velocity of said solids is reduced.

11. The solids mixing and storage vessel of claim 10 in combination with a furnace, wherein the lower end of said solids transfer tube is located within said furnace, and including an opaque tubular section located along the length of said transfer tube to inhibit the radiant heat transfer from said furnace.

12. The combination of the solids mixing and storage vessel and furnace of claim 11 wherein said furnace is suitable for single crystal boule manufacture from a shallow, molten pool of material and said furnace comprises:

a. an enclosed housing having a first through opening supporting a rotatably mounted shaft;

b. a support platform carried on the received end of said shaft, centrally located within said housing and carried thereon, a substantially flat-bottomed, quartz crucible resting within a graphite cup, said crucible and cup having circular bottom walls and cylindrical side walls;

c. a furnace entirely surrounding said crucible and cup, and formed of a cylindrical heater closely surrounding said cylindrical side walls, and an annular bottom plate heater located beneath the said circular bottom walls;

d. a quartz ring concentrically received within said crucible and supported therein above said bottom wall of said crucible a slight distance to divide said crucible into an outer annular zone and a central zone;

e. a centrally located boule withdrawal compartment extending coaxially with said shaft and including means to dip a seed crystal of material into a molten pool contained within said central zone of said crucible and to slowly withdraw said boule therefrom;

f. means to slowly rotate said shaft and support plate and said crucible and cup supported thereon;

g. means to slowly rotate said boule counterrotationally to the rotation of said shaft; and with said discharge end of said vertical transfer tube located within said outer annular zone, for conveying granular polycrystalline material from said solids mixing and storage vessel.

13. The combination of the solids mixing and storage vessel and furnace of claim 12 wherein said transfer tube terminates with its lowermost end above the upper level of said molten pool.

14. The solids mixing and storage vessel of claim 9 including means to introduce an inert gas into said boule withdrawal chamber and means to withdraw said inert gas from said housing.

15. The solids mixing and storage vessel of claim 9 including a granular solids hopper supported externally of said housing and in communication with said supply conduit as the source of granular material thereto.

16. The solids mixing and storage vessel of claim 9 including means to introduce an inert gas into said boule withdrawal chamber and means to withdraw said inert gas from said housing.

17. The solids mixing and storage vessel of claim 8 wherein said material supply conduit terminates with its lowermost end above the upper level of said molten pool.

18. A conveyor for granular solids which receives a source discharge of said granular solids at one end thereof, said conveyor formed of a V-shaped trough mounted horizontally on a support with means permitting its reciprocal movement along its longitudinal axis, and a vibratory motor secured to said trough to vibrate said trough along its longitudinal axis, and a solids introduction hopper located at said one end of said trough, said hopper formed by a baffle transversely oriented in said trough, but spaced above the lower inner edge thereof with its lower edge being located at the angle of repose of said granular solids discharged from said solids source.

* * * * *